US008861069B2

(12) United States Patent
Lim et al.

(10) Patent No.: US 8,861,069 B2
(45) Date of Patent: Oct. 14, 2014

(54) ELECTROPHORETIC DISPLAY DEVICE AND METHOD OF FABRICATION THEREOF

(75) Inventors: Yu-Sok Lim, Seoul (KR); Oh-Nam Kwon, Gyeonggi-Do (KR); Seung-Han Paek, Gyeonggi-Do (KR); Choon-Ho Park, Gyeonggi-Do (KR)

(73) Assignee: LG Display Co., Ltd., Seoul (KR)

( * ) Notice: Subject to any disclaimer, the term of this patent is extended or adjusted under 35 U.S.C. 154(b) by 441 days.

(21) Appl. No.: 13/173,806

(22) Filed: Jun. 30, 2011

(65) Prior Publication Data

US 2012/0008191 A1 Jan. 12, 2012

(30) Foreign Application Priority Data

Jul. 6, 2010 (KR) .................... 10-2010-0065080

(51) Int. Cl.
G02B 26/00 (2006.01)
G09G 3/34 (2006.01)
G02F 1/133 (2006.01)
G02F 1/167 (2006.01)
H01L 27/12 (2006.01)

(52) U.S. Cl.
CPC ............. G02F 1/167 (2013.01); H01L 27/1214 (2013.01); G02F 2001/1672 (2013.01)
USPC ................. 359/296; 430/31; 349/33

(58) Field of Classification Search
USPC ............. 359/296; 430/31–32, 34, 38; 349/33; 204/450, 600; 250/208.1
See application file for complete search history.

(56) References Cited

U.S. PATENT DOCUMENTS

| 6,922,275 | B2 | 7/2005 | Ikeda | |
|---|---|---|---|---|
| 7,474,295 | B2 | 1/2009 | Matsuda | |
| 7,907,328 | B2* | 3/2011 | Aoki | 359/296 |
| 2003/0222261 | A1* | 12/2003 | Murade | 257/58 |
| 2004/0145561 | A1* | 7/2004 | Ikeda | 345/107 |
| 2007/0002259 | A1* | 1/2007 | SangChul et al. | 349/155 |
| 2007/0297039 | A1* | 12/2007 | Lee et al. | 359/296 |
| 2010/0163881 | A1* | 7/2010 | Kang et al. | 257/59 |

FOREIGN PATENT DOCUMENTS

| CN | 1888962 A | 1/2007 |
|---|---|---|
| CN | 100424574 C | 10/2008 |
| CN | 101393370 | 3/2009 |
| CN | 101393370 A | 3/2009 |
| CN | 101770130 A | 7/2010 |
| JP | 2006349903 A | 12/2006 |
| KR | 10-20060030630 | 4/2006 |
| KR | 10-2006-0112782 | 11/2006 |
| KR | 10-20080006036 | 1/2008 |
| TW | 200413809 | 8/2004 |
| TW | 200804865 A | 1/2008 |

* cited by examiner

*Primary Examiner* — Dawayne A Pinkney
(74) *Attorney, Agent, or Firm* — McKenna Long & Aldridge, LLP

(57) ABSTRACT

Disclosed is an electrophoretic display (EPD) device and fabrication method thereof that has a simplified fabrication process and reduced fabrication costs. In the EPD device, a partition wall is formed directly on a first substrate having a pixel electrode and extended up a lateral surface of the partition wall to prevent dead areas in the pixel region, provide increased aperture ratio, and enhanced image quality.

22 Claims, 12 Drawing Sheets

ELECTROPHORETIC DISPLAY DEVICE AND METHOD OF FABRICATION THEREOF

CROSS-REFERENCE TO RELATED APPLICATIONS

Pursuant to 35 U.S.C. §119(a), this application claims the benefit of Korean Patent Application Nos. 10-2010-0065080 and 10-2010-0068128 filed on Jul. 6, 2010 respectively, the contents of which are incorporated by reference for all purposes as if fully set forth herein.

BACKGROUND OF THE INVENTION

1. Field of the Invention

The present invention relates to an electrophoretic display device and method of fabrication thereof. More particularly, the present invention relates to an electrophoretic display device and method of fabrication in which an electrophoretic material is directly applied on a substrate formed with a thin-film transistor, thereby reducing fabrication costs and shortening fabrication time.

2. Description of the Related Art

An electrophoretic display device is an image display device that uses a phenomenon in which colloidal particles move to either one of the polarities when a pair of electrodes to which a voltage is applied is immersed into a colloidal solution. In contrast to a liquid crystal display device, an electrophoretic display (EPD) device has advantages such as wide viewing angle, high reflectivity, low power consumption, and the like, without using a backlight. Thus, an electrophoretic display device is expected to be widely used as a flexible display such as an electronic paper.

The EPD device has a structure in which an electrophoretic layer is interposed between two substrates. One of the two substrates is made of a transparent substrate and the other substrate is provided with an array substrate formed with a driving element to display images in a reflective mode in which light entering from the outside of the device is reflected.

FIG. 1 is a view illustrating an electrophoretic display device 1 of the related art. As illustrated in FIG. 1, the electrophoretic display device 1 may include a first substrate 20 and a second substrate 40, a thin-film transistor and a pixel electrode 18 formed on the first substrate 20, a common electrode 42 formed on the second substrate 40, an electrophoretic layer 60 formed between the first substrate 20 and the second substrate 40, and an adhesive layer 56 formed between the electrophoretic layer 60 and the pixel electrode 18.

The thin-film transistor may include a gate electrode 11 formed on the first substrate 20, a gate insulation layer 22 formed over the whole first substrate 20 formed with the gate electrode 11, a semiconductor layer 13 formed on the gate insulation large 22, and a source electrode 15 and a drain electrode 16 formed on the semiconductor layer 13. A passivation layer 24 is formed on the source electrode 15 and drain electrode 16 of the thin-film transistor.

The pixel electrode 18 is formed on the passivation layer 24 and applies a signal to the electrophoretic layer 60. A contact hole 28 is formed through the passivation layer 24, so that the pixel electrode 18 is connected to the drain electrode 16 of the thin-film transistor through the contact hole 28.

Furthermore, a color filter layer 44 and a common electrode 42 are formed on the second substrate 40. The electrophoretic layer 60 is formed on the color filter layer 44 and the adhesive layer 56 is formed on the electrophoretic layer 60. The electrophoretic layer 60 may include a capsule 70 filled with white particles 74 and black particles 76 therein. If a signal is applied to the pixel electrode 18, then an electric field is generated between the common electrode 42 and the pixel electrode 18, and the white particles 74 and the black particles 76 inside the capsule 70 are moved in a direction of the common electrode 42 or pixel electrode 18 by the electric field, thereby displaying an image.

For example, when a negative (−) voltage is applied to the pixel electrode 18 on the first substrate 20 and a positive (+) voltage is applied to the common electrode 42 on the second substrate 40, white particles 74 with positive (+) charge are moved to the side of the first substrate 20 and black particles 76 with negative (−) charge are moved to the side of the second substrate 40. In this state, if light is entered from the outside, i.e., an upper portion of the second substrate 40, then incident light is reflected by the black particles 76, thereby implementing black on the electrophoretic display device.

In contrast, when a positive (+) voltage is applied to the pixel electrode 18 on the first substrate 20 and a negative (−) voltage is applied to the common electrode 42 on the second substrate 40, white particles 74 with positive (+) charge are moved to the side of the second substrate 40 and black particles 76 with negative (−) charge are moved to the side of the first substrate 20. In this state, if light is entered from the outside, i.e., an upper portion of the second substrate 40, then incident light is reflected by the white particles 74, thereby implementing white on the electrophoretic display device.

An electrophoretic display device having the foregoing structure illustrated in FIG. 1 may have the following problems.

First, the method of fabricating an electrophoretic display device in the related art has difficulty in attaching the first substrate and the second substrate.

In the electrophoretic display device of the related art, the first substrate 20 and second substrate 40 are individually fabricated, and then the first substrate 20 and second substrate 40 are attached to each other using an adhesive layer 56 to complete the process. More specifically, a thin-film transistor for driving a unit pixel and the pixel electrode 18 for applying an electric field to the electrophoretic layer are formed on the first substrate 20, and the common electrode 42, the color filter layer 44, the electrophoretic layer 60 and the adhesive layer 56 are formed on the second substrate 40. Then, the first substrate 20 and the second substrate 40 are attached to each other to complete the process.

However, the unit pixel in a typical electrophoretic display device may be formed with a small size of less than 150 micrometer in the height and width thereof. Thus, it may be difficult to accurately align the electrophoretic layer. If the electrophoretic layer is not accurately aligned with the first substrate formed with a thin-film transistor when aligning the electrophoretic layer, then an electric field is not accurately delivered to electrophoretic particles, thereby causing a driving error.

Second, the method of fabricating an electrophoretic display device in the related art has a complicated fabrication process.

The first substrate 20 and the second substrate 40 are fabricated in a different process, and then transferred by a transfer means and attached to each other in the attachment process, and thus it may be impossible to form an in-line fabrication process.

Third, electrostatic discharge generated during the process of attaching the first substrate and second substrate may cause failure in the initial alignment of electrophoretic particles.

The common electrode 42, the color filter layer 44 and the electrophoretic layer 60 are formed on the second substrate 40, and the adhesive layer 56 is coated on the electrophoretic layer 60. Furthermore, a protection film is adhered to the adhesive layer 56 in order to prevent the reduction of the adhesive force of the adhesive layer 56 and prohibit foreign materials from being adhered to the adhesive layer 56. However, the protection film should be peeled off from the second substrate 40 to adhere the second substrate 40 to the first substrate 20. Electrostatic charge is generated during the process of peeling off the protection film and may cause misalignment in the initial alignment of electrophoretic particles. The misalignment of electrophoretic particles due to electrostatic discharge may generate moiré with a comb-tooth-shaped pattern during the operation of the electrophoretic display device.

SUMMARY OF THE INVENTION

Accordingly, the present invention is directed to an electrophoretic display device and method for manufacturing the same that substantially obviate one or more problems due to limitations and disadvantages of the related art.

An advantage of the present invention is to provide an electrophoretic display device and fabrication method thereof in which an electrophoretic layer is directly formed on a substrate formed with a thin-film transistor, thereby preventing misalignment between the electrophoretic layer and the first substrate, as well as reducing the fabrication cost and simplifying the fabrication process.

Another advantage of the present invention is to provide an electrophoretic display device and fabrication method thereof in which a second pixel electrode electrically connected to a first pixel electrode formed for each pixel is formed on a lateral surface of the partition wall, thereby preventing the failure of driving electrophoretic particles in a dead zone of the electric field generated by the partition wall.

Additional features and advantages of the invention will be set forth in the description which follows; and in part will be apparent from the description, or may be learned by practice of the invention. These and other advantages of the invention will be realized and attained by the structure particularly pointed out in the written description and claims hereof as well as the appended drawings

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Figure 1:
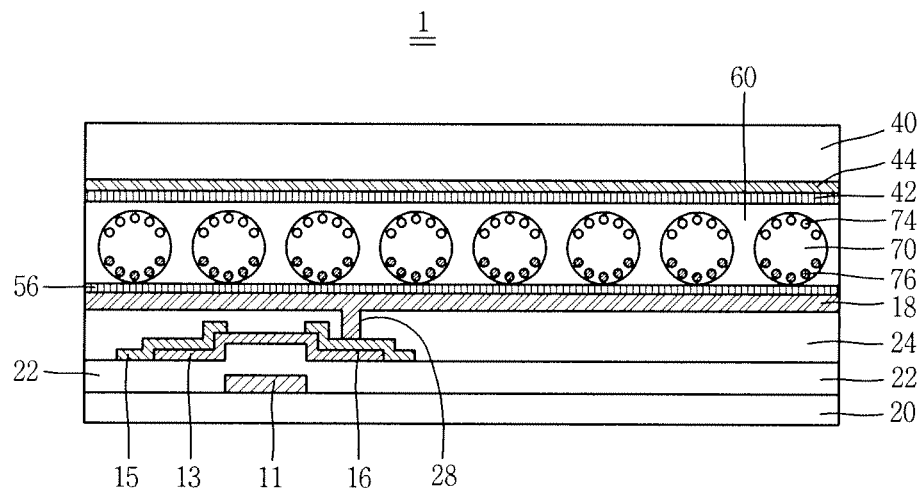
FIG. 1 is a cross-sectional view illustrating an electrophoretic display device in the related art.

Hereinafter, an electrophoretic display (EPD) device according to the present invention will be described in detail with reference to the accompanying drawings.

According to the present disclosure, an electrophoretic layer may be formed on a first substrate having a thin-film transistor. In particular, an electrophoretic layer may be formed subsequent to the process of fabricating a thin-film transistor. Accordingly, the fabrication process of an EPD device can be drastically simplified compared to the method of the related art in which an electrophoretic layer is formed on a second substrate and then the second substrate is attached to the first substrate using a different process to complete the EPD device.

Typically, according to the method of fabricating an electrophoretic display device in the related art in which an electrophoretic layer is formed on a second substrate, the electrophoretic layer is supplied from another factory. The electrophoretic layer could be supplied from another component supplier, and transferred to a fabrication factory to form a thin-film transistor, and then attached to the first substrate. Using this method causes a problem that the fabrication process may be delayed and burdensome as well as the second substrate may be damaged during the process of transferring the second substrate by a transport means such as a vehicle.

FIGS. 2A through 2H are sectional views illustrating a method of fabricating an electrophoretic display device according to a first embodiment of the present invention. Generally, an electrophoretic display (EPD) device is comprised of a plurality of unit pixels, but for the sake of convenience of explanation, only one pixel is illustrated in the drawings.

The terms used in this embodiment will be defined. A display region refers to a region where pixels are arranged on the first substrate, and a non-display region refers to an outer portion of the display region, namely, a region where pixels are not formed thereon.

Figure 2A:
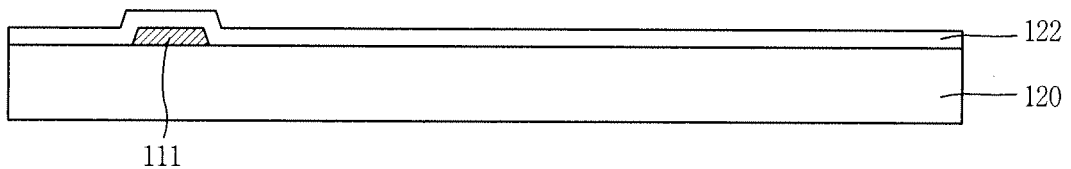
FIGS. 2A through 2H are sectional views illustrating a method of fabricating an electrophoretic display device according to a first embodiment of the present invention.

First, as illustrated in FIG. 2A, a non-transparent metal such as Cr, Mo, Ta, Cu, Ti, Al or Al alloy, having a good conductivity is deposited on a first substrate 120 comprised of a display region and a non-display region and formed of a transparent material such as glass, plastic or the like, using a sputtering process. The non-transparent material is then etched by a photolithography process to form a gate electrode 111, and then an inorganic insulation material such as $SiO_2$, SiNx, or the like is deposited over the entire first substrate 120 including the gate electrode 111 using a chemical vapor deposition method (CVD) to form a gate insulation layer 122.

Figure 2B:
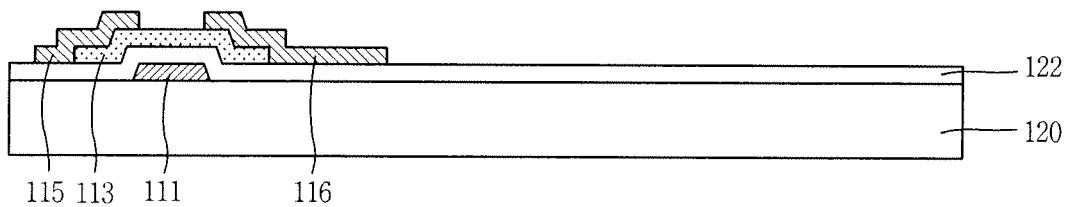

Subsequently, as illustrated in FIG. 2B, a semiconductor material such as amorphous silicon (a-Si) is deposited over the entire first substrate 120 using a CVD method and then etched to form a semiconductor layer 113. Furthermore, though not shown in the drawing, impurities are doped into part of the semiconductor layer 113 or amorphous silicon added with impurities added is deposited thereon to form an ohmic contact layer for ohmic contacting a source electrode and a drain electrode, which will be formed thereafter, with the semiconductor layer 113.

Figure 2C:
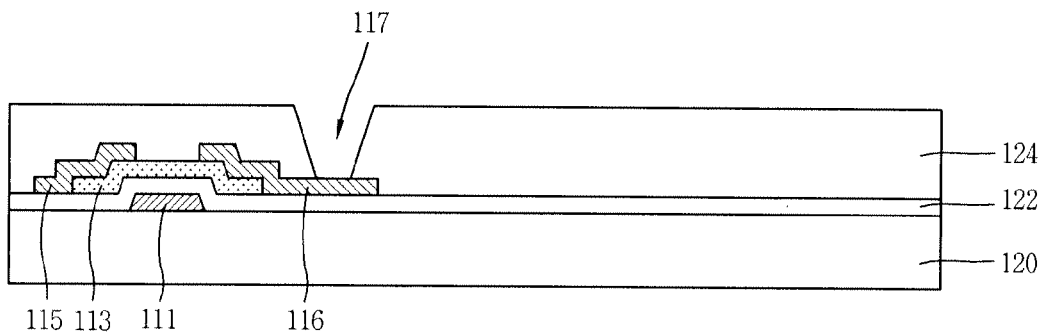

Then, as illustrated in FIG. 2C, a non-transparent metal such as Cr, Mo, Ta, Cu, Ti, Al or Al alloy having a good conductivity is deposited on the first substrate 120 using a sputtering method and then etched to form a source electrode 115 and a drain electrode 116 on the semiconductor layer 113. An inorganic insulation material such as benzo cyclo butene (BCB) or photo acryl is subsequently deposited over the entire first substrate 120 including the source electrode 115 and drain electrode 116 to form a passivation layer 124.

Furthermore, though not shown in the drawing, the passivation layer 124 may be formed to have a plurality of layers. For example, the passivation layer 124 may be formed with a double layer having an organic insulation layer made of an organic material such as BCB or photoacryl and an inorganic insulation layer made of an inorganic insulation material such as $SiO_2$, SiNx, or the like, and otherwise formed with an inorganic insulation layer, an organic insulation layer, and an inorganic insulation layer. The surface of the passivation layer 124 will be formed flat by forming an organic insulation layer and the interface characteristic of the passivation layer 124 will be enhanced by applying an inorganic insulation layer.

Furthermore, a contact hole 117 is formed on the passivation layer 124 to expose the drain electrode 116 to the outside of the thin-film transistor.

Figure 2D:
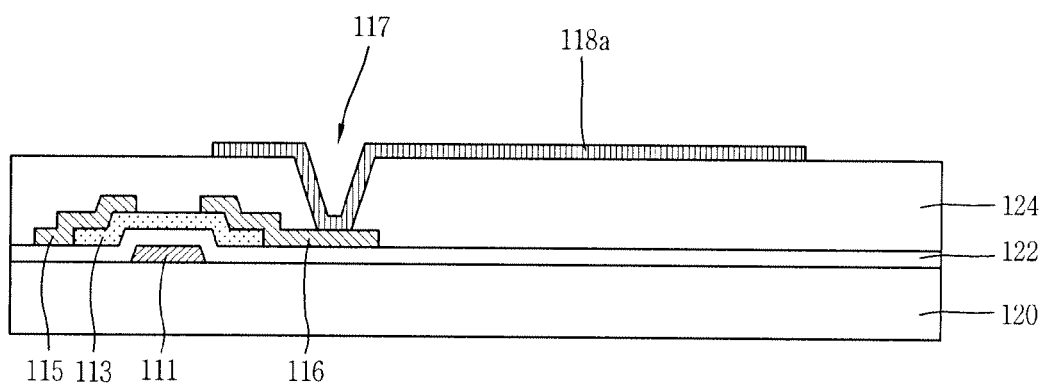

Subsequently, as illustrated in FIG. 2D, a first pixel electrode 118a is formed for each pixel in a display region on the passivation layer 124. Here, the first pixel electrode 118a is electrically connected to the drain electrode 116 of the thin-film transistor through the contact hole 117.

The first pixel electrode 118a may be formed by depositing a transparent conductive material such as indium tin oxide (ITO) and indium zinc oxide (IZO) or a metal such as Mo and AlNd, and then etching it using a photolithography process. Furthermore, the first pixel electrode 118a may be formed with a plurality of metal layers. In other words, it may be formed by depositing a plurality of metal layers such as Cu and MoTi, and then etching it using a photolithography process. In addition, the first pixel electrode 118a may be formed by using a carbon nanotube or water-soluble conductive polymer.

Figure 2E:
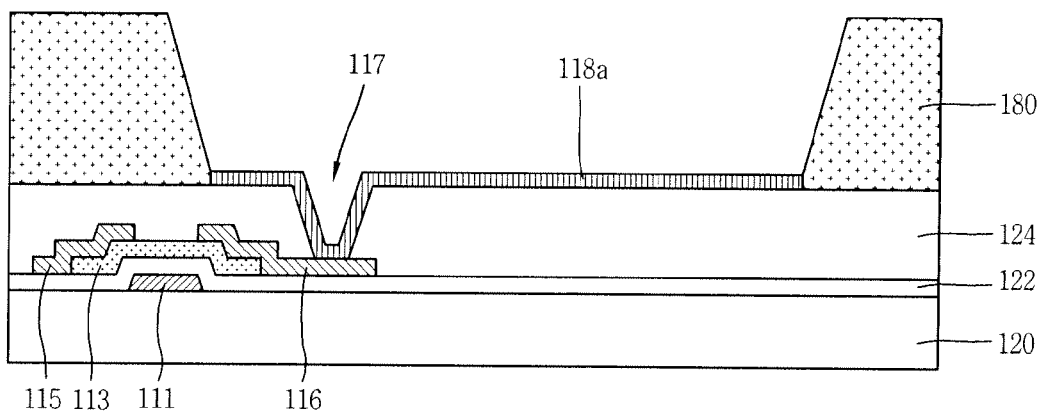

Then, as illustrated in FIG. 2E, a partition wall 180 is formed on the passivation layer 124. The partition wall 180 is formed between the pixels in the display region. The pixel is actually defined by the partition wall 180. Though not shown in the drawing, the partition wall 180 is formed along a boundary region of the pixels arranged in a matrix form on the first substrate 120. Thus, the partition wall 180 is also formed in a matrix form on the first substrate 120.

The partition wall 180 may be formed by depositing an insulation layer made of a resin material and then etching it by a photolithography process using a photoresist, or may be formed by depositing a photosensitive resin and then etching it by a photolithography process. Furthermore, the partition wall 180 may be formed by printing patterned partition walls 180 by a printing method such as printing roll, or may be formed by fabricating a mold formed with grooves corresponding to the partition walls and then transferring an insulation material of the mold to the first substrate 120. In addition, the partition wall 180 may be formed by using an imprint method.

The formation of the partition wall 180 is not limited by a particular method. The description of the particular method as mentioned above is not provided to limit the present invention, but merely provided for the sake of convenience of explanation. The partition wall 180 may be formed by various publicly-known methods.

Figure 2F:
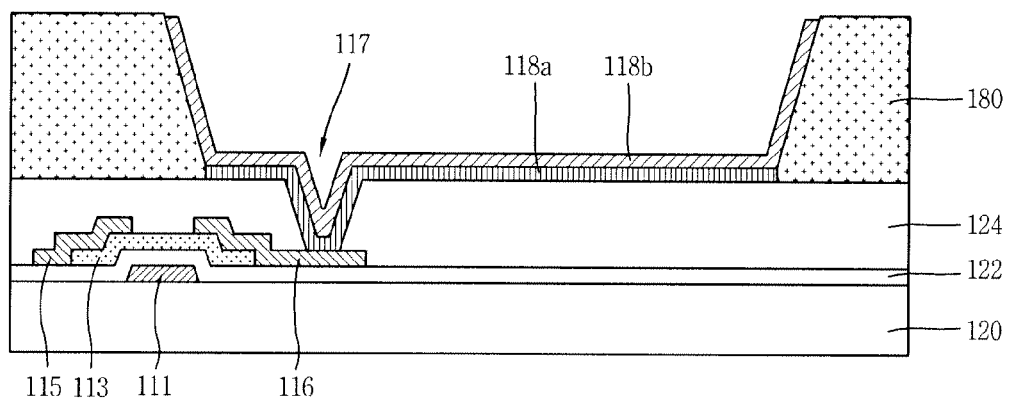

Then, as illustrated in FIG. 2F, a second pixel electrode 118b is formed on the first pixel electrode 118a and on a side wall of the partition wall 180. Here, the first pixel electrode 118a and second pixel electrode 118b are directly brought into contact with each other, and thus electrically connected to each other. Accordingly, the second pixel electrode 118b is electrically connected to the drain electrode 116 through the first pixel electrode 118a and contact hole 117. Thus an image signal is transmitted to the second pixel electrode 118b through the drain electrode 116.

The second pixel electrode 118b may be formed by depositing a transparent conductive material such as ITO and IZO or a metal such as Mo and ALNd on the first pixel electrode 118a, and then etching it using a photolithography process, or may be formed by depositing a carbon nanotube or water-soluble conductive polymer. Furthermore, the second pixel electrode 118b may be formed with a double metal layer by sequentially depositing a plurality of metal layers such as Cu and MoTi, and then etching it.

The second pixel electrode 118b may be formed on a side wall of the partition wall 180 as well as on the first pixel electrode 118a formed within a unit pixel.

The rationale for extending the second pixel electrode 118b up to a side wall of the partition wall 180 as well as forming only on the first pixel electrode 118a will be described as follows.

First, extending the second pixel electrode 118b up a side wall of the partition wall 180 results in an enhanced image quality. When only the first pixel electrode 118a is formed on the passivation layer 124, the first pixel electrode 118a is not normally formed at the first pixel electrode 118a placed at the lowest position, i.e., at an edge region between the partition wall 180 and the passivation layer 124. As a result, when an electric field is applied, this region becomes a dead area to which the electric field is abnormally applied. Such a dead area causes many problems such as reduced aperture ratio of the liquid crystal display device, and reduced contrast, and the like.

However, when a second pixel electrode 118b is formed at a side wall of the partition wall 180. As illustrated in the present invention, the second pixel electrode 118b is formed up to an edge region between the partition wall 180 and the passivation layer 124. Thus a dead area is not created. As a result, the aperture ratio contrast, and response speed are improved.

Second, forming the second pixel electrode 118b at a side wall of the partition wall 180 results in a better process.

Though it will be described in the subsequent process, an electrophoretic material is filled in an upper region of the first substrate 120 defined by the partition wall 180 and passivation layer 124. When only the first pixel electrode 118a is formed on the passivation layer 124 and another pixel electrode is not formed at a side wall of the partition wall 180, the surface characteristic of the first pixel electrode 118a at an upper portion of the passivation layer 124 is different from that of the partition wall 180 at the time of filling the electrophoretic material. Thus, the electrophoretic material may not be well coated on a surface of the partition wall 180 at the time of filling the electrophoretic material. As a result, the injection of the electrophoretic material will not be easily implemented. In order to prevent this problem, the surface of the partition wall 180 may be plasma-treated or chemically treated to enhance the surface characteristic. However, this process is complicated and increases the cost of manufacture.

However, when the second pixel electrode 118b is extended up a side wall of the partition wall 180 as well as on the first pixel electrode 118a formed on the passivation layer 124, an electrophoretic material may be easily coated at a lateral surface of the partition wall 180, i.e., a lateral surface formed with the second pixel electrode 118b, without additional surface treatment, and thus the electrophoretic material may be smoothly filled into the partition wall 180.

The second pixel electrode 118b is not formed at an upper portion of the partition wall 180. If the second pixel electrode 118b is formed at an upper portion of the partition wall 180, then the second pixel electrodes 118b formed at pixels adjacent to one another are electrically connected to one another, and thus it may be preferable to remove the second pixel electrode 118b at an upper portion of the partition wall 180 at the time of forming the second pixel electrode 118b.

To avoid the pixels being electrically connected to each other, the second pixel electrode 118b may be formed up to a part of the upper portion of the partition wall 180. In other words, if a predetermined region of the second pixel electrode 118b can be removed from the upper portion of the partition wall 180 to electrically isolate the second pixel electrode 118b at an adjoining pixel, then the second pixel electrode 118b may be extended up to the upper portion of the partition wall 180.

Figure 2G:
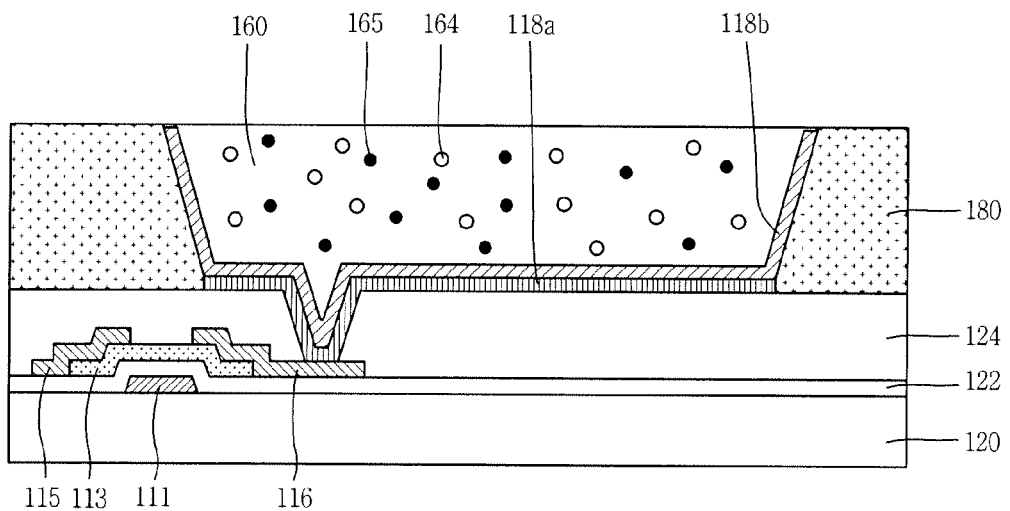

Then, as illustrated in FIG. 2G, an electrophoretic material is filled in a pixel between the partition walls 180 to form an electrophoretic layer 160.

The electrophoretic material is formed of particles havin positive charge or negative charge characteristics. The particles may be white particles 164 and black particles 165, and may be color particles such as cyan, magenta, and yellow, or color particles such as red (R), green (G), and blue (B).

Particles having a good reflectivity such as TiO2 may be used for the white particles 164, and particles having a black characteristic such as carbon black may be used for the black particles 165. Here, the white particles 164 may have a negative charge characteristic and the black particles 165 may have a positive charge characteristic. In the alternative, the white particles 164 may have a positive charge characteristic and the black particles 165 may have a negative charge characteristic.

Furthermore, in a case of color particles, as pigments having a charge characteristic, the color particles may have a negative or positive charge.

A dispersive medium such as an emulsion polymer may be contained in the electrophoretic material. For the dispersive medium, black, white and color particles may be distributed therein, and it may be a liquid, such as an emulsion polymer, or may be air itself. The dispersive medium being air itself as described above means that particles are moved in air when a voltage is applied, even without the dispersive medium.

When an emulsion polymer is used for the dispersive medium, a black dispersive medium or color dispersive medium may be used for the dispersive medium. In case of using a black dispersive medium, light entered from the outside is absorbed to allow clear black to be displayed at the time of implementing black, thereby enhancing the contrast. Furthermore, a color dispersive medium may be used when implementing color by an electrophoretic material, and at the time of color implementation, each color pixel contains the corresponding color dispersive medium, thereby showing clearer color.

The electrophoretic material may be a material in which capsules filled with electronic ink are distributed in a polymer binder. Here, electronic ink distributed within the capsule is composed of white particles (or white ink) and black particles (or black ink). The white particles and black particles have a positive charge and a negative charge characteristic, respectively.

On the other hand, a particular material may not be used but all currently known particles may be used for the white particles, black particles, or color particles. The filling of the electrophoretic material into the partition wall 180 may be implemented by various methods, and the method of filling such an electrophoretic material will be described as follows.

Figure 3A:
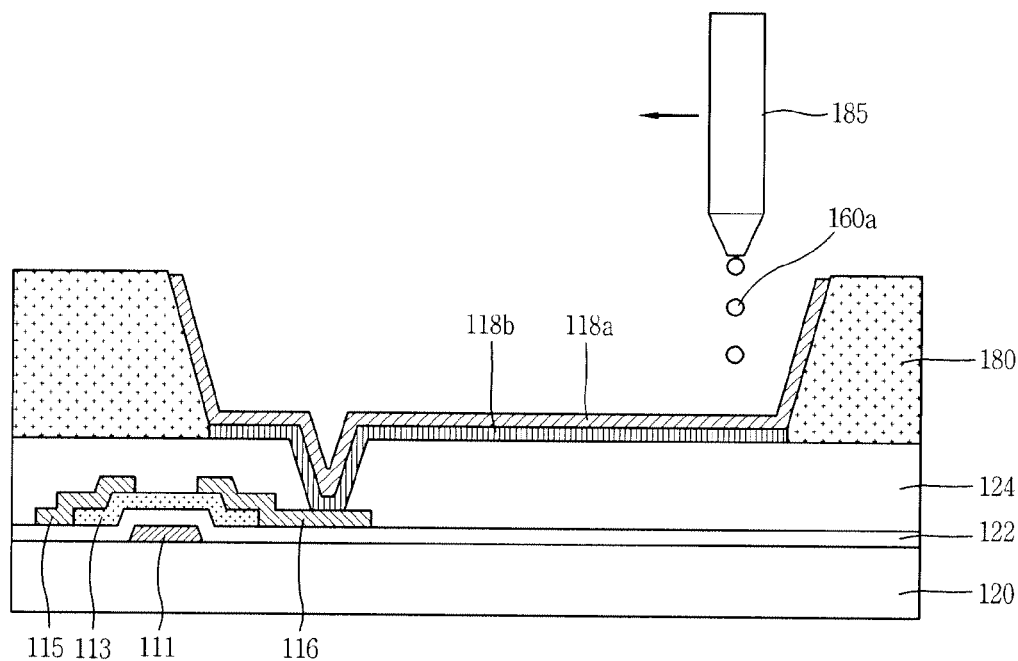
FIGS. 3A and 3B are sectional views illustrating the method of forming an electrophoretic layer in an electrophoretic display device according to the present invention, respectively.
Figure 3B:
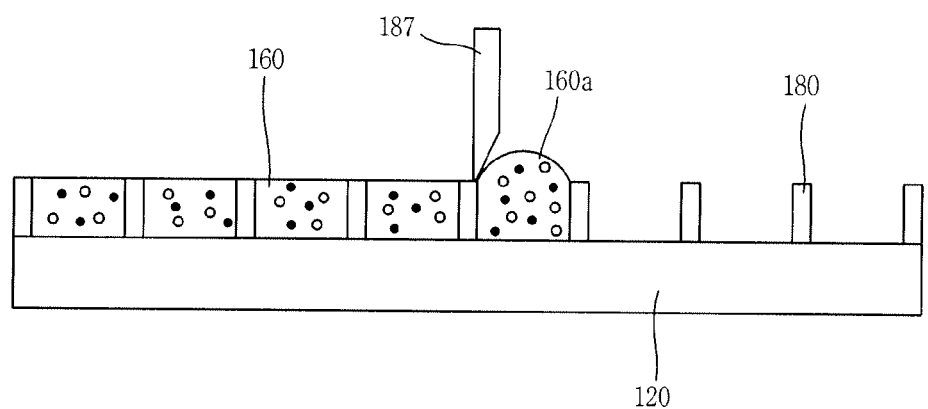

FIGS. 3A and 3B are views illustrating the method of filling an electrophoretic material into the partition wall 180 formed on the first substrate 120 to form an electrophoretic layer 160 in an EPD device.

The method illustrated in FIG. 3A relates to an inkjet method or nozzle method, and as illustrated in FIG. 3A, an electrophoretic material 160a is filled into a syringe (or nozzle) 185, and then the syringe 185 is placed at an upper portion of the first substrate 120. Then, as the syringe 185 is moved on the first substrate 120 in a state that a pressure is applied to the syringe 185 by an external air supply device (not shown), the electrophoretic material 160a is dropped on a pixel between the partition walls 180 to form an electrophoretic layer 160 on the first substrate 120.

The method illustrated in FIG. 3B relates to a squeeze method or nozzle method, and as illustrated in FIG. 3B, an electrophoretic material 160a is coated at an upper portion of the first substrate 120 formed with a plurality of partition walls 180, and then moved on the first substrate 120 by the squeeze bar 187. Thus, the electrophoretic material 160a is filled into a pixel between the partition walls 180 in the unit pixel by the pressure of the squeeze bar 187 to form an electrophoretic layer 160.

The present invention will not be limited to the foregoing methods of filling the electrophoretic material. The foregoing methods illustrate examples of the process of forming an electrophoretic layer 160 that can be used in the present invention. The present invention will not be limited to these processes. For example, various other processes of forming the electrophoretic layer 160 such as a casting printing method, a bar-coating printing method, a screen printing method, and a mold printing method may be applicable to the present invention.

Figure 2H:
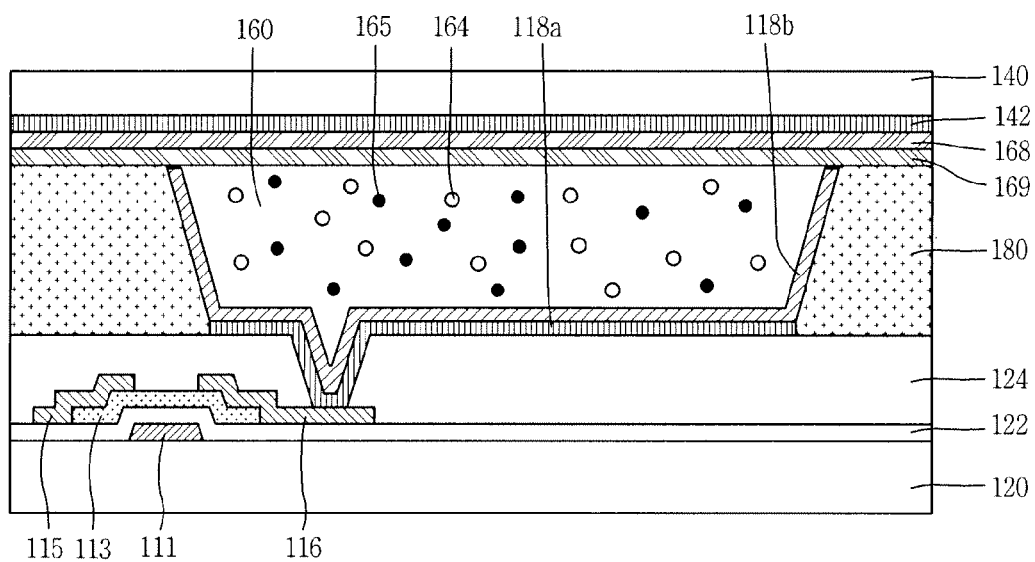

Subsequently, as illustrated in FIG. 2H, a sealing layer 168 is formed by coating a sealing material on the electrophoretic layer 160 as described above to seal the electrophoretic layer 160, and then the first substrate 120 and the second substrate 140 are attached to each other to complete the electrophoretic display device.

The sealing layer 168 is provided to prevent the electrophoretic layer 160 composed of dyes having a low viscosity from overflowing to the outside or adjoining pixels. Furthermore, the sealing layer 168 is provided to prevent moisture from being infiltrated into the electrophoretic layer 160 and causing a failure of the electrophoretic layer 160.

The sealing layer 168 may be formed on both an upper surface of the electrophoretic layer 160 and an upper end of the partition walls 180. However, some charged electrophoretic particles may be electrically adhered to the sealing layer 168, causing an error in the initial arrangement of electrophoretic particles. As a result, the sealing layer 168 may not be formed over an entire upper surface of the electrophoretic layer 160 but may be formed only on an upper end of the electrophoretic layer 160.

In contrast, in order to solve the problem in which electrophoretic particles are electrically adhered to the sealing layer 168, an interlayer 169 may be further formed on the electrophoretic layer 160 after the electrophoretic layer 160 has been filled for each sub-pixel, thereby preventing electrophoretic particles from being directly brought into contact with the sealing layer 168. When the interlayer 169 is used, the electrophoretic particles 164, 165 do not adhere to the sealing layer 168, thereby reducing the generation of failed pixels.

The interlayer 169 may be a photosensitive organic material like the partition wall 180, for example, ethyl ketone. The interlayer 169 may be formed by coating a material of thickness of several nanometers at an upper end of the electrophoretic layer 160 and partition wall 180. The interlayer 169 completely seals the electrophoretic layer in a temporary manner, thereby facilitating the formation of a sealing layer, as well as solving the problem of electrophoretic particles being adhered to the sealing layer.

Furthermore, though the first substrate 120 and second substrate 140 are attached by the sealing layer 168 as illustrated in FIG. 2H, an adhesive layer may be formed to enhance an attachment force between the first substrate 120 and second substrate 140. The adhesive layer may be formed at an outer region of the electrophoretic display device, i.e., only on the sealing layer 168 at an upper portion of the partition wall 180, or may be formed on the entire sealing layer 168 at an upper portion of the electrophoretic layer 160.

A common electrode 142 may be formed on the second substrate 140 made of a transparent material such as glass or plastic. The common electrode 142 may be formed by depositing a transparent conductive material such as ITO or IZO.

Furthermore, though not shown in the drawing, a color filter layer may be formed on the second substrate 140. The color filter layer is comprised of red (R), green (G) and, blue (B) color filters, thereby implementing color when the electrophoretic material is formed of black particles and white particles.

The structure of the electrophoretic display device fabricated by the foregoing method will be described in detail below with reference to FIG. 2H.

As illustrated in FIG. 2H, a partition wall 180 is formed directly on the first substrate 120 and an electrophoretic layer 160 is also filled between the partition walls 180 of the first substrate 120. Thus, the electrophoretic layer 160 is directly formed on the second pixel electrode 118 to be directly brought into contact with the first pixel electrode 118a. Accordingly, in contrast to the electrophoretic display device of the related art, an additional adhesive layer for adhering the electrophoretic layer 160 between the pixel electrode 118a/b and the passivation layer 124 is not required.

Furthermore, in an electrophoretic display device according to the present disclosure, the pixel electrode may be formed with a double layer having a first pixel electrode 118a and a second pixel electrode 118b, and at this time, the first pixel electrode 118a is formed only on a unit pixel and the second pixel electrode 118b is formed on the unit pixel as well as a side wall of the partition wall 180. The first pixel electrode 118a and second pixel electrode 118b are brought into contact with each other at an upper portion of the passivation layer 124 to be electrically connected to each other. Thus, a voltage applied to the first pixel electrode 118a via a thin-film transistor is also transferred to the second pixel electrode 118b. Consequently, a voltage is also applied to the second pixel electrode 118b between the partition wall 180 and passivation layer 124, thereby preventing image quality from being reduced due to a dead area in this region.

The operation of an electrophoretic display device having the foregoing configuration will be described as follows. When an electrophoretic material is formed of white particles 164 and black particles 165, the white particles 164 have a positive charge or negative charge characteristic, if a signal is input from the outside and passed through a thin-film transistor formed on the first substrate 120 and applied to the first pixel electrode 118, then the white particles 164 are moved in the electrophoretic layer 160 by an electric field generated between the first pixel electrode 118 and the common electrode 142.

For example, if a positive (+) voltage is applied to the first pixel electrode 118a and the second pixel electrode 118b when the white particles 164 have positive (+) charge, then the white particles 164 with positive (+) charge is moved to the side of the second substrate 140 because the common electrode 142 of the second substrate 140 relatively has a negative (−) potential. Accordingly, if light is entered from the outside, namely, an upper portion of the second substrate 140, then incident light may be mostly reflected by the white particles 164, thereby implementing white on the electrophoretic display device.

At this time, a density of white particles 164 moving to the side of the second substrate 140 or a distance from the second substrate 140 varies according to the intensity of a voltage applied to the first pixel electrode 118a and second pixel electrode 118b, and thus the intensity of light entered from the outside to be reflected by white particles 164 also varies, thereby implementing a desired brightness.

On the contrary, if a negative (−) voltage is applied to the first pixel electrode 118a and the second pixel electrode 118b, then the white particles 164 with positive (+) charge is moved to the side of the first substrate 120 because the common electrode 142 of the second substrate 140 has a positive (+) potential. Accordingly, if light is entered from the outside, then incident light is mostly not reflected, thereby implementing black.

On the other hand, if a positive (+) voltage is applied to the first pixel electrode 118a and the second pixel electrode 118b when the white particles 164 have negative (−) charge, then the white particles 164 with negative (−) charge is moved to the side of the first substrate 120 because the common electrode 142 of the second substrate 140 relatively has a negative (−) potential. Accordingly, if light is entered from the outside, then incident light is mostly not reflected, thereby implementing black on the electrophoretic display device.

On the contrary, if a negative (−) voltage is applied to the first pixel electrode 118a and the second pixel electrode 118b, then the white particles 164 with negative (−) charge is moved to the side of the second substrate 140 because the common electrode 142 of the second substrate 140 has a positive (+) potential. Accordingly, if light is entered from the outside, then incident light is mostly reflected by the white particles 164, thereby implementing white.

When the electrophoretic material is formed of color particles, R, G and B color particles or color particles such as cyan, magenta and yellow may be moved to the second substrate 140 according to a signal applied to the first pixel electrode 118a and second pixel electrode 118b, thereby implementing the relevant color or a color mixed with another pixel.

If the electrophoretic material is formed of a polymer binder in which capsules filled with white particles and black particles are distributed, then white particles and black particles contained in electronic ink distributed in the capsules have a positive charge and a negative charge characteristic, respectively. Accordingly, if a signal is input from the outside and applied to the first pixel electrode 118a and second pixel electrode 118b, then white particle and black particles are separated by an electric field generated between the first pixel electrode 118a and second pixel electrode 118b and the common electrode 142. For example, if a negative (−) voltage is applied to the first pixel electrode 118a and the second pixel electrode 118b, then the white particles 164 with positive (+) charge is moved to the side of the first substrate 120, and black particles with negative (−) charge is moved to the side of the second substrate 140 because the common electrode 142 of the second substrate 140 relatively has a positive (+) potential. In this state, if light is entered from the outside, namely, an upper portion of the second substrate 140, then incident light may be reflected by the black particles, thereby implementing black on the electrophoretic display device.

On the contrary, if a positive (+) voltage is applied to the first pixel electrode 118a and the second pixel electrode 118b, then the white particles 164 with positive (+) charge is moved to the side of the second substrate 140, and black particle with negative (−) charge is moved to the side of the first substrate 120 because the common electrode 142 of the second substrate 140 has a negative (−) potential.

In this state, if light is entered from the outside, namely, an upper portion of the second substrate 140, then incident light may be reflected by the white particles, thereby implementing white.

Here, if white particles and black particles in the capsules have a negative charge and positive charge characteristic, respectively, then white and black may be implemented by the inverse operation.

Figure 4:
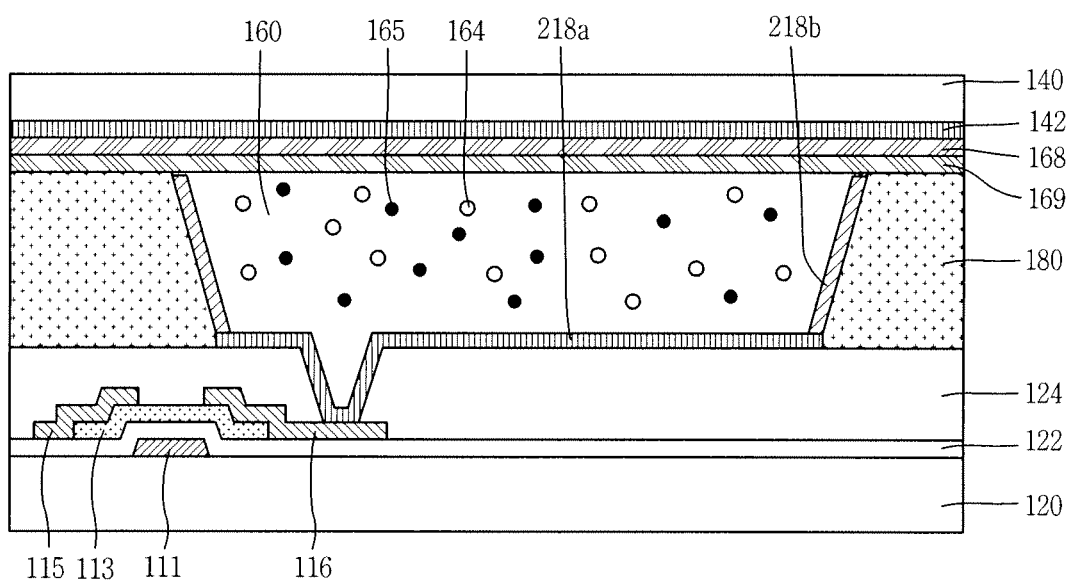
FIG. 4 is a cross-sectional view illustrating the structure of an electrophoretic display device according to a second embodiment of the present invention.

FIG. 4 is a sectional view illustrating the structure of an electrophoretic display device according to a second embodiment of the present invention. As illustrated in FIG. 4, an electrophoretic display device according to this embodiment has the same structure except for the shape of the pixel electrode 218, compared to the electrophoretic display device illustrated in FIG. 2H. Accordingly, only the structure different therefrom will be primarily described in the following description.

As illustrated in FIG. 4, the first pixel electrode 218a is formed on the passivation layer 124 and the second pixel electrode 218b is formed only on a side wall of the partition wall 180. In this embodiment, the second pixel electrode 218b is formed on an end portion of first pixel electrode 218a and formed on the partition wall 180, whereas the second pixel electrode is formed on the first pixel electrode to be extended up to a side wall of the partition wall in the structure illustrated in FIG. 2H. However, even in this structure, the first pixel electrode 218a and the second pixel electrode 218b are overlapped and electrically connected to each other at a lower portion of the partition wall 180, thereby preventing the region from being a dead area.

The first pixel electrode 218a may be formed prior to or subsequent to forming the partition wall 180. In a case of forming the first pixel electrode 218a prior to forming the partition wall 180, a transparent conductive layer or metal layer is deposited and etched to form the first pixel electrode 218a, and then the partition wall 180 is formed in a non-display region of the passivation layer 124. Subsequently, a transparent conductive layer or metal layer is deposited and etched to form the second pixel electrode 218b on a side wall of the partition wall 180.

In a case of forming the first pixel electrode 218a subsequent to forming the partition wall 180, the partition wall 180 is formed in a non-display region of the passivation layer 124, and then a transparent conductive layer or metal layer is deposited and etched to form the first pixel electrode 218a in a display region on the passivation layer 124, and then a transparent conductive layer or metal layer is deposited and etched again to form the second pixel electrode 218b on a side wall of the partition wall 180.

In another embodiment, the pixel electrode may not be formed in a double layer, but may be formed in one layer. The structure of this embodiment will be described below with reference to FIG. 5A. The description for the structure similar to the previous embodiment will be omitted but only the structure different therefrom will be described.

Figure 5A:
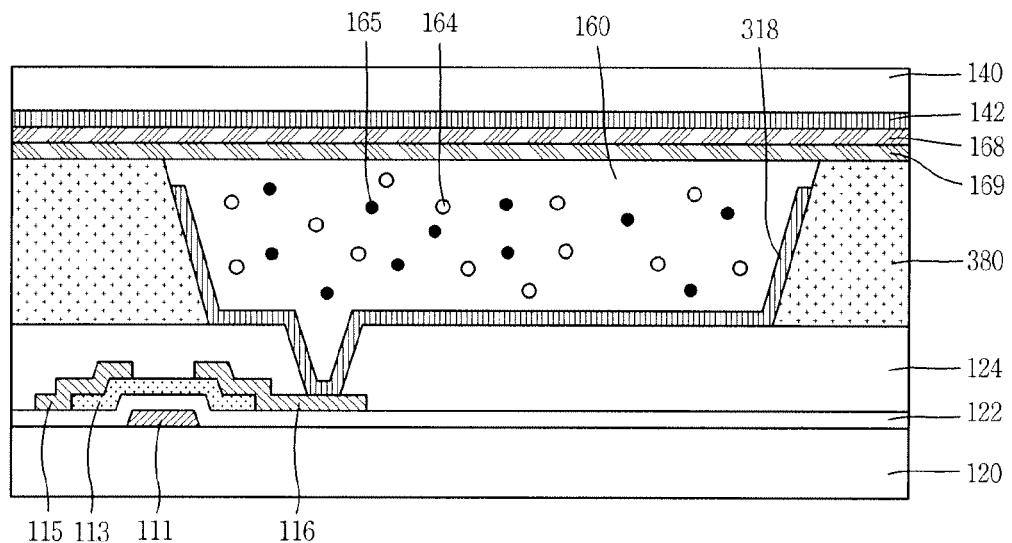
FIG. 5A and 5B are a cross-sectional view illustrating the structure of an electrophoretic display device according to a third embodiment of the present invention.

As illustrated in FIG. 5A, according to an electrophoretic display device having the foregoing structure, a thin-film transistor is formed on the first substrate 120 and a passivation layer 124 is formed to cover the thin-film transistor on the first substrate 120. A partition wall 180 is formed in a non-display region on the passivation layer 124, and a pixel electrode 318 is formed on the passivation layer 124 of the display region and on a side wall of the partition wall 380 in the non-display region. At this time, the pixel electrode 318 at an upper portion of the passivation layer 124 and the pixel electrode 318 on a side wall of the partition wall 380 may be formed as an integral body.

In contrast to the fabrication method illustrated in FIGS. 2A through 2H, according to the method of fabricating the electrophoretic display device as illustrated in FIG. 5, the pixel electrode 318 is formed after forming the partition wall 380. That is, in this fabrication process, the partition wall 380 is formed on the passivation layer 124 and then a transparent conductive material such as ITO and IZO or a metal such as Mo and AlNd is deposited on the passivation layer 124 and partition wall 380, thereafter the deposited transparent conductive material or metal is etched using a photolithography process to formed the pixel electrode 318.

In this manner, according to this embodiment, the pixel electrode 318 on the passivation layer 124 and the pixel electrode 318 on the partition wall 380 may be integrally formed, thereby simplifying the process of forming the pixel electrode.

The passivation layer 124 may be formed in a double layer having an organic insulation layer made of an organic material such as BCB or photoacryl and an inorganic insulation material such as $SiO_2$, SiNx, or the like. And, the partition wall 380 may be formed by using, for example, a resin or photosensitive resin.

Figure 5B:
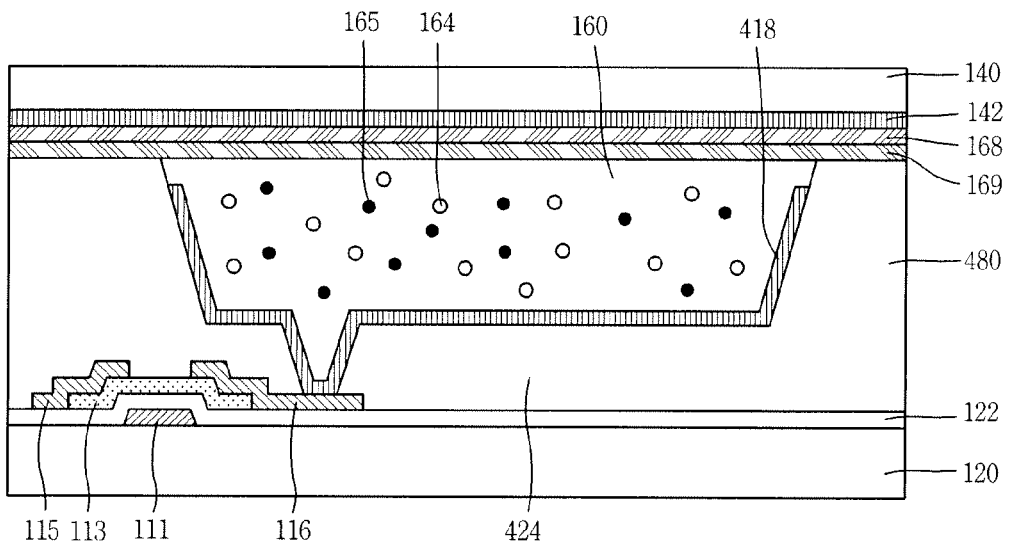

Further, as shown in FIG. 5B the passivation layer 424 and partition wall 480 may be formed of the same material. When the passivation layer 424 and partition wall 480 are of the same material, the passivation layer 424 and partition wall 480 may be formed by different processes, respectively, or may be formed by using the same process.

As described above, when the passivation layer 424 and partition wall 480 are formed by different processes, the passivation layer is, first of all, formed on a substrate, and then a resin or photosensitive resin is deposited and patterned on the passivation layer using another process to form a partition wall.

However, the passivation layer and partition wall may be formed in the same process. Hereinafter, the method of fabricating the electrophoretic display device according to the fourth embodiment of the present invention where the passivation layer and partition wall are formed using the same process will be described with reference to FIGS. 6A through 6D.

Figure 6A:
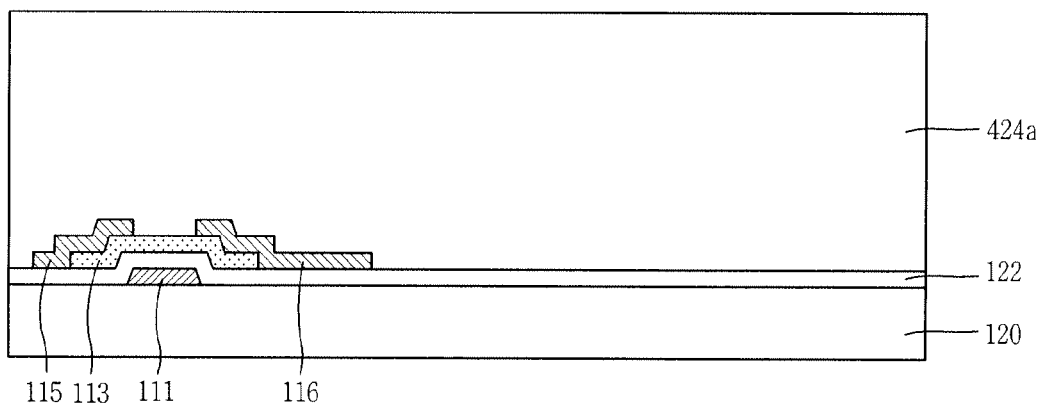
FIGS. 6A through 6D are sectional views illustrating the method of fabricating an electrophoretic display device according to a fourth embodiment of the present invention.

First, as illustrated in FIG. 6A, a thin-film transistor having a gate electrode 111, a gate insulation layer 122, a semiconductor layer 113, a source electrode 115, and a drain electrode 116 is formed in a unit pixel of a first substrate 120. The thin-film transistor may be fabricated using a process similar to the process in the first embodiment illustrated in FIGS. 2A and 2B.

Subsequently, an insulation layer 424a is formed over the first substrate 120 to cover the thin-film transistor. The insulation layer 424a may be formed with a photosensitive resin.

Figure 6B:
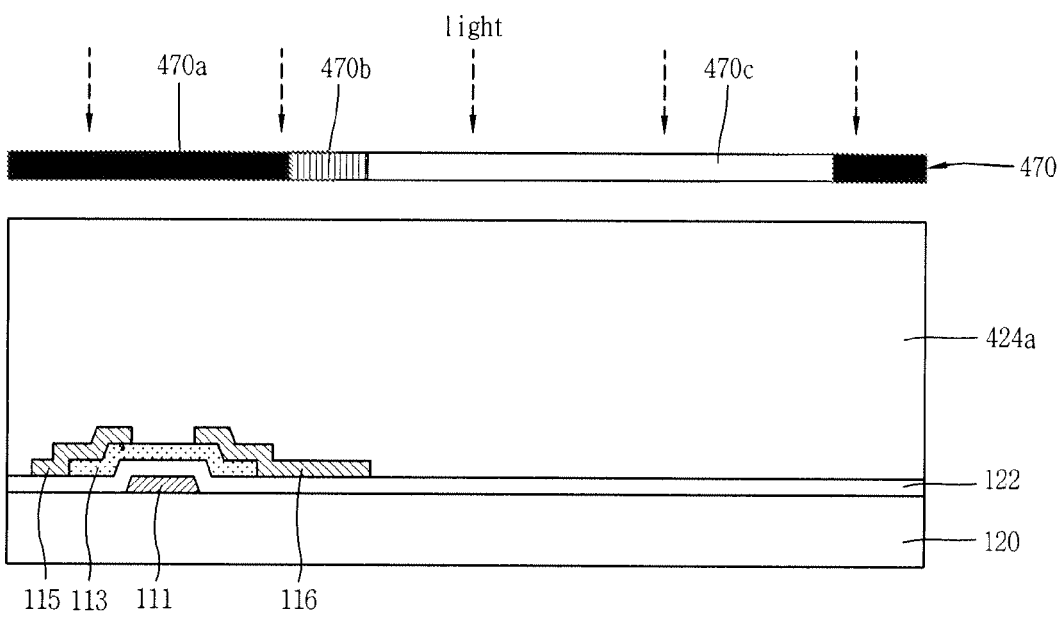

Thereafter, as illustrated in FIG. 6B, a mask 470 is positioned above the insulation layer 424a. The mask 470 is a half-tone mask including a blocking part 470a, a half-transparent part 470b, and a transparent part 470c, so that a portion of the insulation layer 424a corresponding to the pixel region is fully exposed, a portion of the insulation layer 424a corresponding to the drain electrode of the thin-film transistor is partially exposed, and a portion of the insulation layer 424a corresponding to the non-pixel region is not exposed.

A diffraction mask may be used as the mask 470. In this diffraction mask, a plurality of slits are formed in the half-transparent part 470b so that a light is partially transmitted through the region.

Figure 6C:
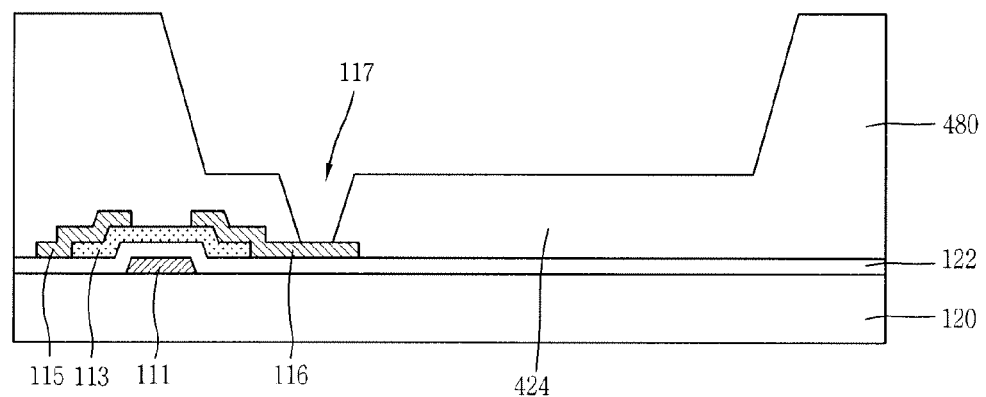

Subsequently, as illustrated in FIG. 6C, a developer is applied on the insulation layer 424a to etch the fully exposed portion 470c and the partially exposed portion 470b of the insulation layer 424a to form a partition wall 480, a passivation layer 424, and a contact hole 117 in the passivation layer 424.

Figure 6D:
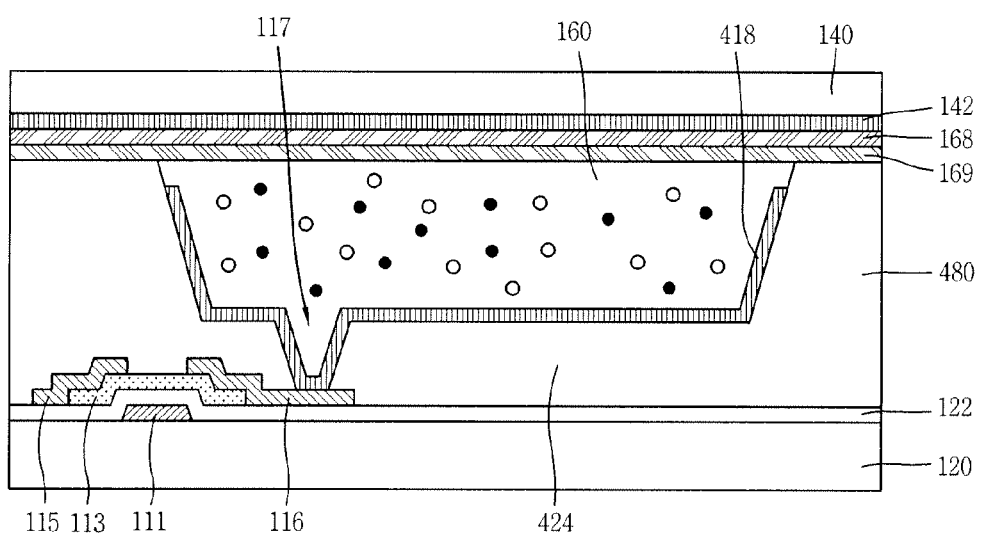

Thereafter, as illustrated FIG. 6D, a pixel electrode 418 formed on the passivation layer 424 and on a side wall of the partition wall 480 is electrically connected to the drain electrode 116 through the contact hole 117. Then an electrophoretic material is filled in the pixel region between the partition walls 480 to form an electrophoretic layer 160. Subsequently, the interlayer 169 is formed on the electrophoretic layer 160 and a sealing layer 168 is formed on the interlayer 169 to seal the electrophoretic layer 160, and then the second substrate 140 formed with a common electrode 142 is attached to the first substrate 120 using the sealing layer 168 or an adhesive agent to complete the electrophoretic display device.

Here, the formation of the electrophoretic layer 160 and the attachment between the substrates 120,140 may be carried out using a process similar to the process illustrated in FIGS. 2G and 2H.

The structure of an electrophoretic display device fabricated using the foregoing process will be described below with reference to FIG. 6D.

As illustrated in FIG. 6D, the structure of the foregoing electrophoretic display device is similar to that of the electrophoretic display device illustrated in FIG. 2H. However, a difference exists in the process. For the electrophoretic display device illustrated in FIG. 2H, the partition wall 180 and passivation layer 124 are fabricated using different processes and thus it may be possible to form the partition wall 180 and passivation layer 124 with different materials. However, in the structure illustrated in FIG. 6D, because the partition wall 480 and passivation layer 424 are formed by one process subsequent to forming an insulation layer 424a, the partition wall 480 and passivation layer 424 are formed of the same material.

Accordingly, when compared to the electrophoretic display device having the structure disclosed in FIG. 2H, the structure of the electrophoretic display device illustrated in FIG. 6D has a simplified fabrication process as well as reduced cost.

FIGS. 7A through 7E illustrate another method of fabricating the electrophoretic display device according to a fourth embodiment of the present invention.

Figure 7A:
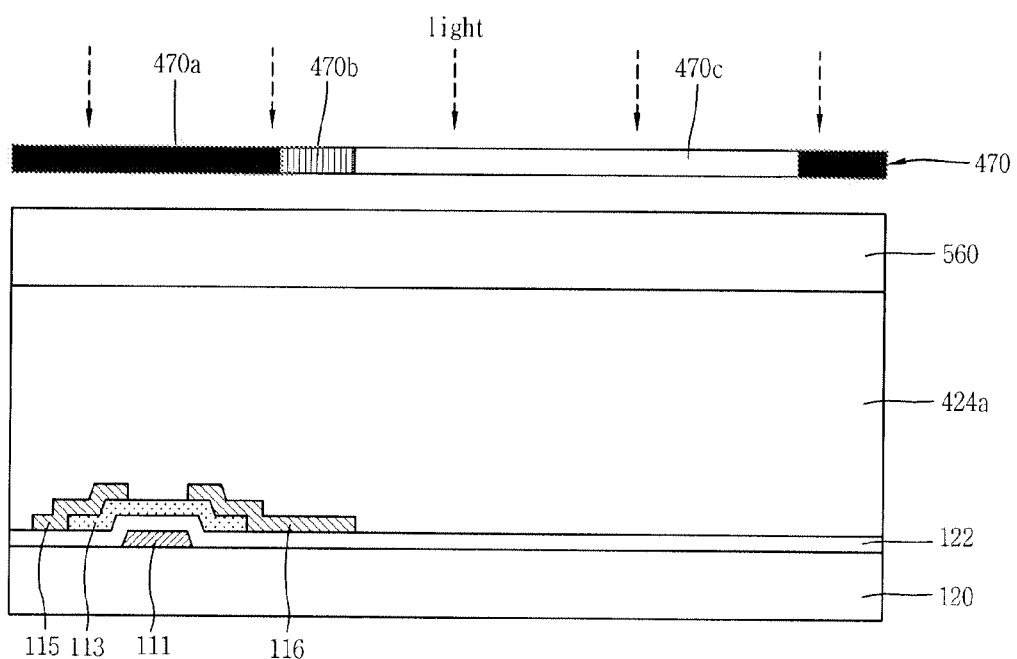
FIGS. 7A through 7E are sectional views illustrating the other method of fabricating an electrophoretic display device of FIG. 5B.

First, as illustrated in FIG. 7A, a thin-film transistor having a gate electrode 111, a gate insulation layer 122, a semiconductor layer 113, a source electrode 115, and a drain electrode 116 is formed in a unit pixel of a first substrate 120. The thin-film transistor may be fabricated using a process similar to the process in the first embodiment illustrated in FIGS. 2A and 2B.

Subsequently, an insulation layer 424a and a photo-resist layer 560 are sequentially formed over the first substrate 120 to cover the thin-film transistor and then the half-tone mask or the diffraction mask 470 including a blocking part 470a, a half-transparent part 470b, and a transparent part 470c is positioned above the photo-resist layer 560 to expose the photo-resist layer 560 with light.

Figure 7B:
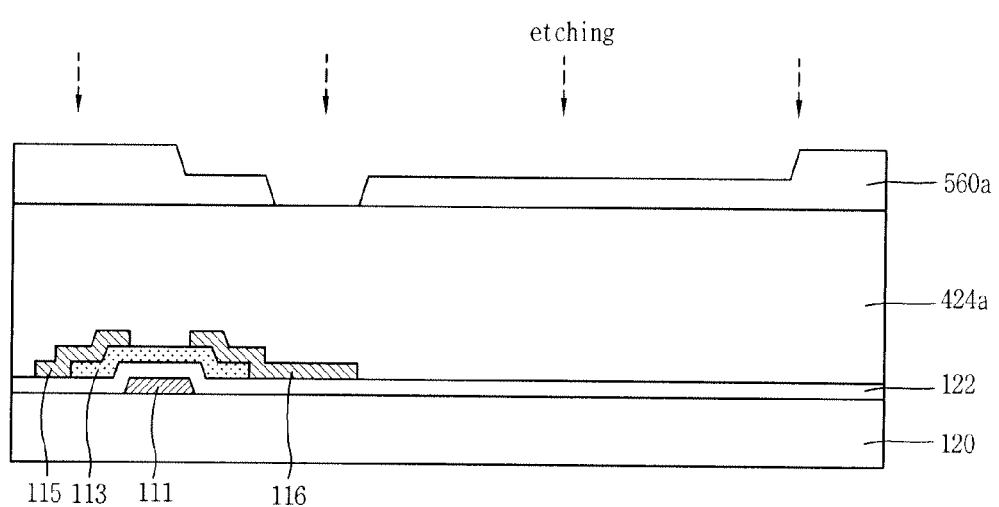

Thereafter, as illustrated in FIG. 7B, the developer is applied to the photo-resist layer 560 to form the first photo-resist pattern 560a and then the etchant is applied to the insulation layer 424a blocked by the first photo-resist pattern 560a to etch the non-blocked area of the insulation layer 424a.

Figure 7C:
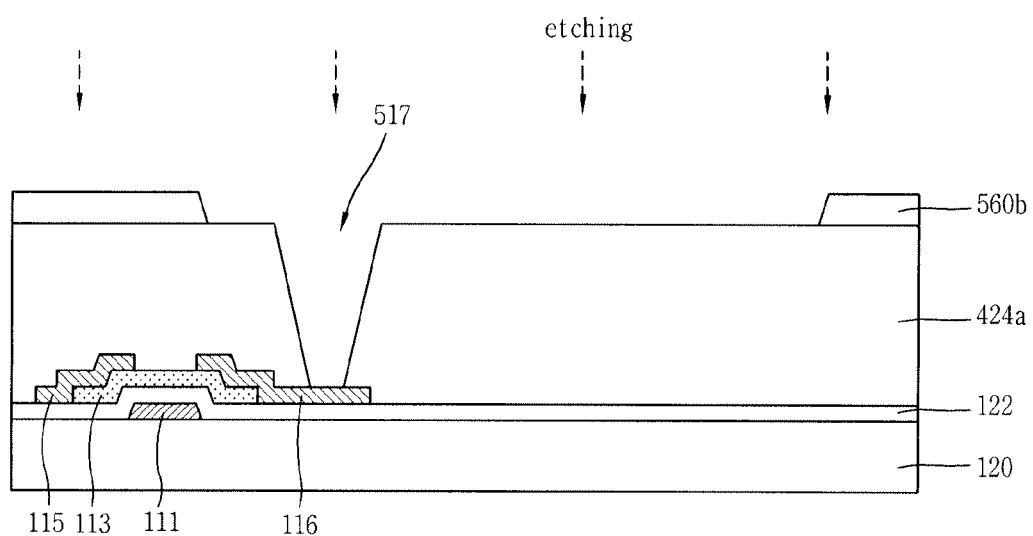

As illustrated in FIG. 7C, a contact hole 517 is formed in the insulation layer 424a by the etching process. Thereafter, the first photo-resist pattern 560a is ashed to form the second photo-resist pattern 560b in which the pixel region is exposed and the etchant is applied to the insulation layer 424a blocked by the ashed second photo-resist pattern 560b to etch the non-blocked area of the insulation layer 424a.

Figure 7D:
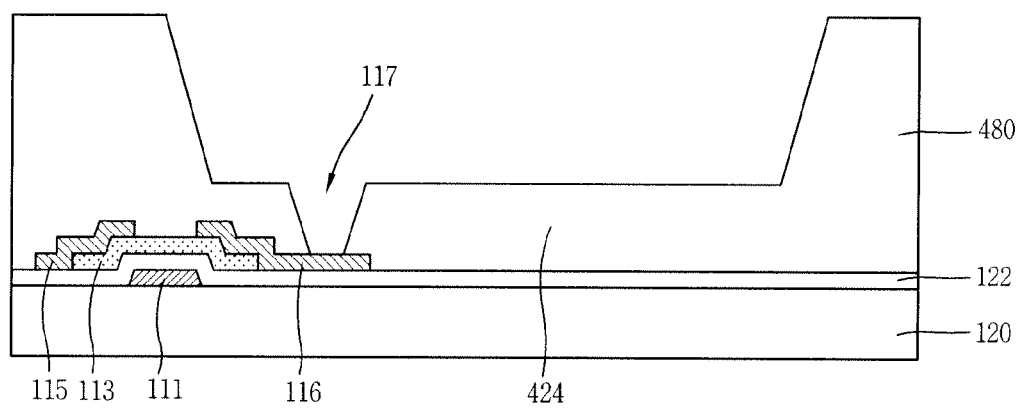

As illustrated in FIG. 7D, the partition wall 480 and the passivation layer 424 are formed by the etching process.

Figure 7E:
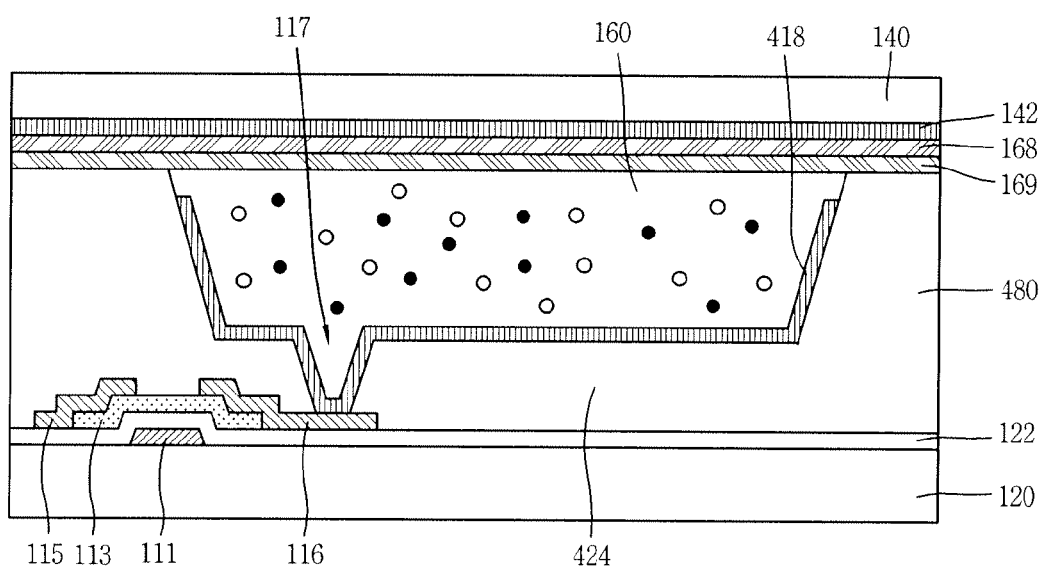

Thereafter, as illustrated FIG. 7E, a pixel electrode 418 formed on the passivation layer 424 and on a side wall of the partition wall 480 is electrically connected to the drain electrode 116 through the contact hole 117. Then an electrophoretic material is filled in the pixel region between the partition walls 480 to form an electrophoretic layer 160. Subsequently, an interlayer 169 and a sealing layer 168 are formed on the electrophoretic layer 160 to seal the electrophoretic layer 160, and then a second substrate 140 formed with a common electrode 142 is attached to the first substrate 120 using the sealing layer 168 or an adhesive agent to complete the electrophoretic display device.

The formation of the electrophoretic layer 160 and the attachment between the substrates 120, 140 may be carried out using a process similar to the process illustrated in FIGS. 2G and 2H.

Furthermore, the partition wall 480 according to the fourth embodiment of the present invention may be formed by applying a pressure to the insulation layer by a mold, or may be formed by an imprint method. In these processes, the contact hole 117 may be formed on the passivation layer to allow the drain electrode to be exposed to the outside by molding or imprinting the insulating layer.

As described above, according to the present disclosure, an electrophoretic layer is formed directly on the first substrate, and thus an adhesive layer for adhering the electrophoretic layer to the second substrate and a passivation film for protecting the adhesive layer is not required. This is in contrast to the related art in which the electrophoretic layer is formed on the second substrate.

Furthermore, when compared to the related art in which an electrophoretic layer may be fabricated by another factory or manufacturer, transferred to be adhered to a second substrate, and then the second substrate is attached to a first substrate, according to the present disclosure, the process of transferring the electrophoretic layer or attaching the electrophoretic layer may not be required, thereby simplifying the fabrication process.

On the other hand, though the foregoing description has been limited to a specific structure of the electrophoretic display device, the electrophoretic display device according to the present disclosure will not be limited the specific structure. In particular, it may be applicable to various currently used electrophoretic layers. In other words, it may be applicable to all kinds of electrophoretic layers having the structure that can be formed on a first substrate.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An electrophoretic display device, comprising:
a first substrate and a second substrate having a plurality of pixels, wherein the first substrate includes a display region and a non-display region outside the display region;
a switching device on the first substrate, wherein the switching device includes a gate electrode, a source electrode and a drain electrode;
an insulating layer on the first substrate;
a passivation layer on the entire first substrate including the source electrode and the drain electrode;
partition walls formed in direct contact with the passivation layer between each of the pixels of the first substrate, wherein the partition walls are formed along a boundary region of the pixels arranged on the first substrate;
a pixel electrode on the passivation layer in the display region of the first substrate and on lateral side walls of the partition walls, wherein the pixel electrode directly contacts the drain electrode via a contact hole in the insulating layer;
an electrophoretic layer in an area defined by the partition walls and pixel electrode, wherein the electrophoretic layer is directly on the pixel electrode, and
wherein the electrophoretic layer includes a dispersive medium having charged particles;
a interlayer on the electrophoretic layer;
a common electrode on the second substrate, wherein the common electrode and second substrate are attached to the first substrate,
wherein the pixel electrode is extended from an upper surface of the passivation to the lateral side wall of the partition wall to substantially cover the lateral side wall of the partition wall.

2. The electrophoretic device of claim 1, wherein the passivation layer and the partition wall are formed of a different material.

3. The electrophoretic device of claim 1, wherein the passivation layer and the partition wall are formed of a same material.

4. The electrophoretic device of claim 1, wherein the passivation layer and the partition wall are formed as a single body.

5. The electrophoretic device of claim 1, wherein the pixel electrode includes a first pixel electrode and a second pixel electrode.

6. The electrophoretic device of claim 5, wherein the first pixel electrode and the second pixel electrode are a single body.

7. The electrophoretic device of claim 5, wherein the first pixel electrode is formed on the passivation layer and directly connects to the drain electrode of the switching device through the contact hole.

8. The electrophoretic device of claim 7, wherein the second pixel electrode is formed on the first pixel electrode and side walls of the partition walls.

9. The electrophoretic device of claim 7, wherein the second pixel electrode is formed only on the side walls of the partition walls.

10. The electrophoretic device of claim 1, wherein the charged particles include at least one of white particles, black particles and color particles.

11. The electrophoretic device of claim 1, wherein the dispersive medium includes liquid or air.

12. The electrophoretic device of claim 1, further comprising a sealing layer formed on the electrophoretic layer and the interlayer.

13. The electrophoretic device of claim 1, further comprising a sealing layer formed on the partition wall.

14. The electrophoretic device of claim 12, wherein the first and second substrates are attached via the sealing layer.

15. A method of fabricating an electrophoretic display device, comprising:
providing first and second substrates having a plurality of pixels, wherein the first substrate includes a display region and a non-display region outside the display region;
forming a thin film transistor having a gate electrode, a gate insulation layer, a semiconductor layer, a source electrode, and a drain electrode in a unit pixel of the first substrate;
forming an insulation layer on an entire surface of the first substrate including the thin film transistor;
positioning a mask including a blocking portion, a half-transparent portion, and a transparent portion on the insulation layer, wherein a portion of the insulation layer corresponding to a display region of the first substrate is fully exposed, a portion of the insulation layer corresponding to the drain electrode of the thin film transistor is partially exposed, and a portion of the insulation layer corresponding to a non-display region of the first substrate is not exposed;
forming partition walls, a passivation layer and a contact hole in the passivation layer by etching the fully exposed and partially exposed portions of the insulation layer; and
forming a pixel electrode on the passivation layer and on side walls of the partition walls forming partition walls in direct contact with a passivation layer between each of the pixels of the first substrate, wherein the partition walls are formed along a boundary region of pixels arranged on the first substrate,
wherein the pixel electrode is extended from an upper surface of the passivation to the lateral side wall of the partition wall to substantially cover the lateral side wall of the partition wall.

16. The method of claim 15, further comprising:
forming an electrophoretic layer by providing an electrophoretic material in the display region of the first substrate between the partition walls;
providing an interlayer on the partition walls;
forming a common electrode on the second substrate; and
attaching the second substrate including the common electrode to the first substrate.

17. The method of claim 15, wherein the partition walls and passivation layer are formed using separate processes.

18. The method of claim 15, wherein the partition walls and passivation layer are formed simultaneously.

19. The method of claim 18, further comprising forming a photo-resist layer on the first substrate and arranging a mask to form the passivation layer and the partition walls.

20. The method of claim 15, wherein the insulation layer is formed of a photosensitive resin.

21. The method of claim 15, wherein forming a pixel electrode on the passivation layer and on side walls of the partition walls comprises forming a first pixel electrode on the insulation layer and a second pixel electrode on sides of the partition walls.

22. The method of claim 21, wherein the first pixel electrode and second pixel electrode are a single body.

* * * * *